US008076993B2

(12) United States Patent
Hamada et al.

(10) Patent No.: US 8,076,993 B2
(45) Date of Patent: Dec. 13, 2011

(54) BALUN CIRCUIT AND INTEGRATED CIRCUIT DEVICE

(75) Inventors: Yasuhiro Hamada, Tokyo (JP); Shuya Kishimoto, Tokyo (JP); Kenichi Maruhashi, Tokyo (JP); Masaharu Ito, Tokyo (JP); Masahiro Tanomura, Tokyo (JP); Naoyuki Orihashi, Tokyo (JP)

(73) Assignee: NEC Corporation, Tokyo (JP)

( * ) Notice: Subject to any disclaimer, the term of this patent is extended or adjusted under 35 U.S.C. 154(b) by 281 days.

(21) Appl. No.: 12/529,891

(22) PCT Filed: Mar. 11, 2008

(86) PCT No.: PCT/JP2008/054354

§ 371 (c)(1), (2), (4) Date: Sep. 3, 2009

(87) PCT Pub. No.: WO2008/114646

PCT Pub. Date: Sep. 25, 2008

(65) Prior Publication Data

US 2010/0117755 A1 May 13, 2010

(30) Foreign Application Priority Data

Mar. 16, 2007 (JP) ................................ 2007-068426

(51) Int. Cl.
*H03H 7/42* (2006.01)
*H01P 3/08* (2006.01)

(52) U.S. Cl. ........................................ 333/26; 333/128

(58) Field of Classification Search .................... 333/25, 333/26, 128, 238, 248
See application file for complete search history.

(56) References Cited

U.S. PATENT DOCUMENTS 7,710,216 B2 * 5/2010 Hamada et al. ................ 333/26

FOREIGN PATENT DOCUMENTS

| | | | |
|---|---|---|---|
| JP | 5-37213 | A | 2/1993 |
| JP | 5-152814 | A | 6/1993 |
| JP | 11-97952 | A | 4/1999 |
| JP | 11-97980 | A | 4/1999 |
| JP | 11-127004 | A | 5/1999 |
| JP | 2000512110 | A | 9/2000 |
| JP | 2000357763 | A | 12/2000 |
| JP | 2000516787 | A | 12/2000 |

(Continued)

OTHER PUBLICATIONS

International Search Report for PCT/JP2008/054354 mailed Apr. 15, 2008.

(Continued)

*Primary Examiner* — Dean Takaoka

(57) ABSTRACT

A balun circuit comprising first through third CPW lines becoming signal I/O ports, a first differential transmission line for linking the central conductor of the second CPW line and the ground conductor of the first CPW line and for linking the ground conductor of the second CPW line and the central conductor of the first CPW line, a second differential transmission line for linking the central conductors of the first and third CPW lines and for linking the ground conductors of the first and third CPW lines, and a joint for connecting at least two ground conductors of the first through third CPW lines. The differential transmission line has a first line formed in a dielectric layer on a substrate, a second line arranged in the underlying layer, and an underlying line at a fixed potential arranged between the substrate and the second line.

21 Claims, 5 Drawing Sheets

FOREIGN PATENT DOCUMENTS

| | | | |
|---|---|---|---|
| JP | 2002043813 | A | 2/2002 |
| JP | 2004096347 | A | 3/2004 |
| WO | 2007034658 | A | 3/2007 |

OTHER PUBLICATIONS

Y. Hamada et al., “A 60-GHz-band Compact IQ Modulator MMIC for Ultra-high-speed Wireless Communication”, 2006 IEEE MTT-S International Microwave Symposium Digest, pp. 1701-1704, Jun. 2006.

D. Kwon, et al., A Wideband Vertical Transition Between Co-Planar Waveguide and Parallel-Strip Transmission Line, IEEE Microwave and Wireless components Letters, Sep. 26, 2005, vol. 15, No. 9, pp. 591-593.

* cited by examiner

BALUN CIRCUIT AND INTEGRATED CIRCUIT DEVICE

This application is the National Phase of PCT/JP2008/054354, filed Mar. 11, 2008, which is based upon and claims the benefit of priority from Japanese patent application No. 2007-068426, filed on Mar. 16, 2007, the disclosure of which is incorporated herein in its entirety by reference.

TECHNICAL FIELD

The present invention relates to a balun circuit suitable for an integrated circuit device and an integrated circuit device having the balun circuit.

BACKGROUND ART

In general, a wireless communication apparatus uses a mixer circuit for frequency conversion to a RF (Radio Frequency) signal for communication, which is a relatively high frequency, from an IF (Intermediate Frequency) signal for signal processing, which is a relatively low frequency, or frequency conversion to an IF signal from a RF signal.

FIG. 1 is a circuit diagram showing a structure of a single balance-type mixer circuit that is used in a wireless communication apparatus and the like.

As shown in FIG. 1, a single balance-type mixer circuit has two mixer elements 51 and 180-degree phase combination circuit 52. Mixer elements 51 mix two IF signals of reverse-phase, which are differential signals, and two local oscillation signals of in-phase (hereinafter, referred to as LO signals) and output an upper sideband signal and a lower sideband signal that are necessary for communication. 180-degree phase combination circuit 52 combines the two inputted signals so that they have a phase difference of 180 degrees and outputs a signal after the combination. Hence, the upper sideband signal and lower sideband signal generated from mixer elements 51 are combined to be in-phase by 180-degree phase combination circuit 52 and are then outputted as a RF signal that is used in the communication.

At this time, although the LO signals, which are unnecessary for communication, are outputted from mixer elements 51, the two LO signals inputted in-phase to mixer elements 51 are outputted in-phase without change. Thus, the LO signals are combined to become reverse-phase by 180-degree phase combination circuit 52, so that they are cancelled and removed.

In the meantime, 180-degree phase combination circuit 52 shown in FIG. 1 can be used as a 180-degree phase splitter when a signal is inputted from the output port (Output) thereof and when it is taken out from the input ports 0, 180. In this case, it is possible to obtain two IF signals having a phase difference of 180 degrees by inputting a RF signal and a LO signal to the mixer elements. The circuit that splits or combines the signals to have a phase difference of 180 degrees is used as a circuit that converts a differential signal into a non-differential signal or a non-differential signal into a differential signal, a circuit that splits a differential signal to a plurality of active elements, a circuit that combines a differential signal, and the like. Due to this, there has been a recent increase in demand such that the 180-degree phase combination circuit (180-degree phase splitting circuit) should be used in a microwave IC that is used in a wireless communication apparatus and the like. Meanwhile, in the microwave IC, a CPW (Coplanar Waveguide) line is used as a transmission line because the processing of the underside surface of a substrate is unnecessary.

In the meantime, in order to split a high frequency signal and to enable two signals after splitting to have a phase difference of 180 degrees, a rat race circuit is generally used. The rat race circuit splits a signal by branching a signal line into two lines and provides the two signal lines after the branching with a length difference corresponding to a ½ wavelength of a signal frequency to be transmitted, thereby enabling the two split signals to have a phase difference of 180 degrees.

However, the line length corresponding to a ½ wavelength of a signal frequency is about several mm or several cm even for a high frequency signal of GHz or more and requires a large circuit area. Due to this, it is difficult to incorporate the rat race circuit into the microwave IC.

Hence, instead of obtaining a phase difference by using a difference of the line lengths, a method has been suggested in which a phase difference of 180 degrees is obtained by using a balun circuit that converts a non-differential transmission line such as CPW line or micro strip line into a differential transmission line such as slot line or CPS (Coplanar Strips) line, or a differential transmission line into a non-differential transmission line (for example, Yasuhiro Hamada, Kenichi Maruhashi, Masaharu Ito, Shuya Kishimoto, Takao Morimoto, and Keiichi Ohata, "A60-GHz-band Compact IQ Modulator MMIC for Ultra-high-speed Wireless Communication," 2006 IEEE MTT-S International Microwave Symposium Digest, pp. 1701-1704, June 2006 (Non-Patent Document 1)).

As shown in FIG. 2, a balun circuit described in Non-Patent Document 1 has first CPW line 61, second CPW line 62*a* and third CPW line 62*b*, which are signal input/output ports, FCPW (Finite Ground Coplanar Waveguide) line 63, first CPS line 65*a* and second CPS line 65*b*, which are differential transmission lines, FCPW-CPW conversion section 64 that converts first CPW line 61 into FCPW line 63, FCPW-CPS conversion branch section 66 that converts FCPW line 63 into first CPS line 65*a* and second CPS line 65*b*, first CPS-CPW conversion section 67*a* that converts first CPS line 65*a* into second CPW line 62*a* and second CPS-CPW conversion section 67*b* that converts second CPS line 65*b* into third CPW line 62*b*, which are formed on substrate 69.

First CPW line 61, second CPW line 62*a*, third CPW line 62*b* and FCPW line 63 are non-differential transmission lines having a central conductor and two ground conductors arranged to sandwich the central conductor therebetween. The two ground conductors of first CPW line 61, second CPW line 62*a*, third CPW line 62*b* and FCPW line 63 are connected by air bridges 68, respectively.

In the balun circuit shown in FIG. 2, first CPW line 61 is converted into FCPW line 63 by CPW-FCPW conversion section 64 and FCPW line 63 is branched and converted into first CPS line 65*a* and second CPS line 65*b* by FCPW-CPS conversion branch section 66. In addition, first CPS line 65*a* is converted into second CPW line 62*a* by first CPS-CPW conversion section 67*a* and second CPS line 65*b* is converted into third CPW line 62*b* by second CPS-CPW conversion section 67*b*. Here, the central conductor of second CPW line 62*a* is connected to the ground conductor of FCPW line 63 and the central conductor of third CPW line 62*b* is connected to the central conductor of FCPW line 63. In addition, the ground conductor of second CPW line 62*a* is connected to the central conductor of FCPW line 63 and the ground conductor of third CPW line 62*b* is connected to the ground conductor of FCPW line 63.

Like this, the relation between the connection of the central and ground connectors of second CPW line 62*a* to the central and ground connectors of FCPW line 63, and the connection of the central and ground connectors of third CPW line 62*b* to the central and ground connectors of FCPW line 63 is reversed. Thus, when a signal is inputted from first CPW line 61, differential signals having a phase difference of 180 degrees are outputted from second CPW line 62*a* and third CPW line 62*b*. Since such structure does not use a method that obtains a phase difference of 180 degrees by an electrical length, it is possible to appropriately shorten the length of the CPS line and to make a circuit size small. Further, since the ground conductors of the respective CPW lines are connected to each other, the ground potential of each CPW line is same and the above structure can be easily applied to an integrated circuit. By connecting the ground conductors, the phase difference of the signals outputted from second CPW line 62*a* and third CPW line 62*b* is not always 180 degrees. However, it is possible to compensate for a deviation of the phase difference by making the lengths of first CPS line 65*a* and second CPS line 65*b* different.

However, the balun circuit of the Non-Patent Document 1 has the following problems.

A first problem is that when the balun circuit is formed on a conductive substrate made of silicon, for example, the insertion loss of the balun circuit is increased. This is caused by a substrate loss. That is, this occurs because the electromagnetic fields occurring in the CPW, FCPW and CPS lines are spread into the substrate and a signal is attenuated by a resistance component of the substrate. Hence, in high frequency lines formed on a conductive substrate, a conductive layer referred to as a ground shield is generally arranged in an underlying layer, which is connected to a ground potential to shield an electric field and thus to prevent a loss by the substrate. However, even when the ground shield is applied to the balun circuit, the power is not equally split and a phase difference is not 180 degrees. In other words, it is impossible to operate as a balun circuit.

This is because the coupling between the ground shield and each of two strip-shaped conductors constituting the CPS line is predominant over the coupling between the strip-shaped conductors, so that a micro strip line mode becomes a main transmission mode and the CPS line section does not resultantly operate a differential transmission line.

A second problem is that it is difficult to reduce the circuit size.

This is caused by the CPS lines of the balun circuit. To be more specific, since the CPS lines are such that the two strip-shaped conductors are arranged in a line, the CPS lines occupy an area obtained by adding at least a gap of the conductors and a conductor width corresponding to two conductors. Furthermore, since the spread of the electromagnetic fields in the horizontal direction is large, it is necessary to keep another circuit including the ground conductors at a distance.

SUMMARY

It is an exemplary object of the present invention to provide a balun circuit which is capable of splitting or combining signals having a phase difference of 180 degrees, easily incorporated into an integrated circuit device while realizing a desired circuit performance and having a small loss even when a conductive substrate is used, and an integrated circuit device having the balun circuit.

In order to achieve the above object, the exemplary aspect of the invention provides a balun circuit comprising:

a first CPW line, a second CPW line and a third CPW line that become signal I/O ports;

a first differential transmission line that links a central conductor of the second CPW line and a ground conductor of the first CPW line and links a ground conductor of the second CPW line and a central conductor of the first CPW line;

a second differential transmission line that links a central conductor of the third CPW line and the central conductor of the first CPW line and links a ground conductor of the third CPW line and the ground conductor of the first CPW line; and a joint that connects two or more among the ground conductor of the first CPW line, the ground conductor of the second CPW line and the ground conductor of the third CPW line, wherein the first differential transmission line and the second differential transmission line have a first line, a second line and an underlying layer connected to a fixed potential arranged between a substrate and the second line, the first line and the second line being formed in a dielectric layer on the substrate and the second line being formed at a position nearer to a substrate than the first line and being electromagnetically coupled to the first line.

Alternatively, a balun circuit of the present invention comprises:

a first CPW line, a second CPW line and a third CPW line that become signal I/O ports;

a first differential transmission line that links a central conductor of the second CPW line and a central conductor of the first CPW line and links a ground conductor of the second CPW line and a ground conductor of the third CPW line;

a second differential transmission line that links a central conductor of the third CPW line and the ground conductor of the first CPW line and links the ground conductor of the third CPW line and the ground conductor of the second CPW line; and a joint that connects two or more among the ground conductor of the first CPW line, the ground conductor of the second CPW line and the ground conductor of the third CPW line, wherein the first differential transmission line and the second differential transmission line have a first line, a second line and an underlying layer connected to a fixed potential arranged between a substrate and the second line, the first line and the second line being formed in a dielectric layer on the substrate and the second line being formed at a position nearer to a substrate than the first line and being electromagnetically coupled to the first line.

Alternatively, a balun circuit of the invention comprises:

a first CPW line, a second CPW line and a third CPW line that become signal I/O ports;

a first differential transmission line that links a central conductor of the second CPW line and a central conductor of the third CPW line and links a ground conductor of the second CPW line and a central conductor of the first CPW line;

a second differential transmission line that links the central conductor of the third CPW line and the central conductor of the second CPW line and links a ground conductor of the third CPW line and a ground conductor of the first CPW line; and a joint that connects two or more among the ground conductor of the first CPW line, the ground conductor of the second CPW line and the ground conductor of the third CPW line, where the first differential transmission line and the second differential transmission line have a first line, a second line and an underlying layer connected to a fixed potential arranged between a substrate and the second line, the first line and the second line being formed in a dielectric layer on the substrate and the second line being formed at a position nearer to a substrate than the first line and being electromagnetically coupled to the first line.

In the above structure, since it is possible to strongly electromagnetically couple the first and second lines by adjusting the line width and gap of the first and second lines, it is possible to enlarge the coupling between the lines even when there is a ground shield. Due to this, the coupling of the first and second lines becomes predominant, not a micro strip mode occurring between the underlying conductor connected to the fixed potential and each of the strip-shaped conductors, so that a differential transmission mode becomes a main transmission mode. Hence, the CPS line section operates as a differential transmission line. As a result, it is possible to realize a balun circuit capable of splitting or combining the signals having a phase difference of 180 degrees.

In addition, since the underlying line connected to the fixed potential shields the electric field, the electric field occurring in the differential transmission line consisting of the first line and the second line does not reach the substrate. Due to this, it is possible to make a balun circuit that has low loss in which no loss is caused by the resistance component of the substrate.

Furthermore, since the differential transmission line does not require a wide line area, such as slot line or CPS line of arranging and coupling two lines on a same plane, it is possible to reduce the circuit size. Due to this, it is possible to easily incorporate the balun circuit into an integrated circuit device and to downsize a circuit of the integrated circuit device having the balun circuit.

Accordingly, it is possible to obtain a balun circuit capable of splitting or combining signals having a phase difference of 180 degrees, and that is easily incorporated into an integrated circuit device while realizing a desired circuit performance and having a small loss even when a conductive substrate is used.

EXEMPLARY EMBODIMENT

Hereinafter, the invention will be described with reference to the drawings.

First Exemplary Embodiment

Figure 3:
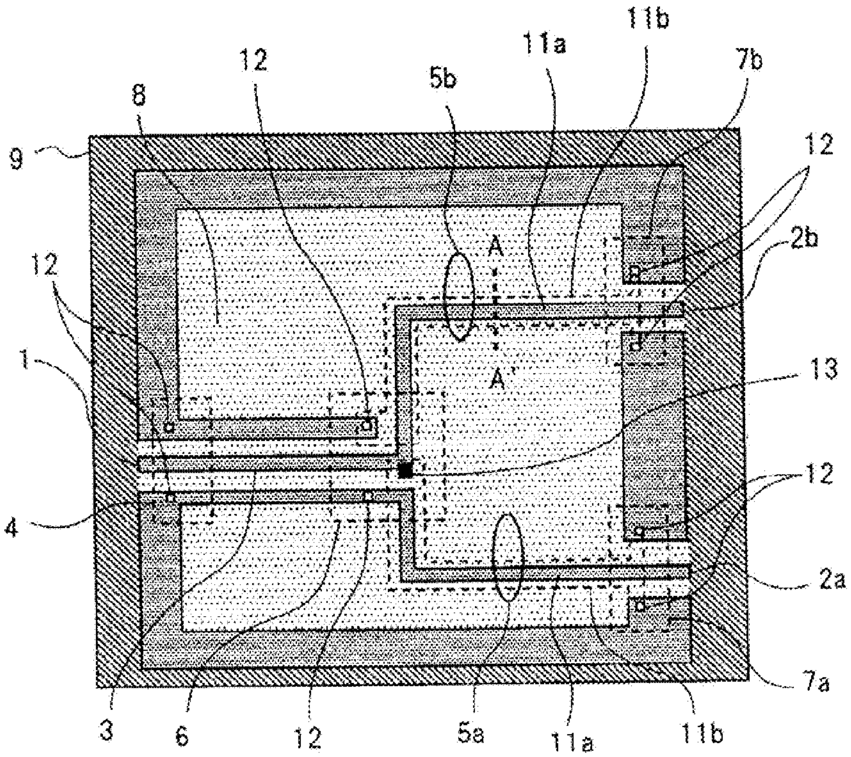
FIG. 3 is a plan view showing a structure of a balun circuit of a first exemplary embodiment.
Figure 4:
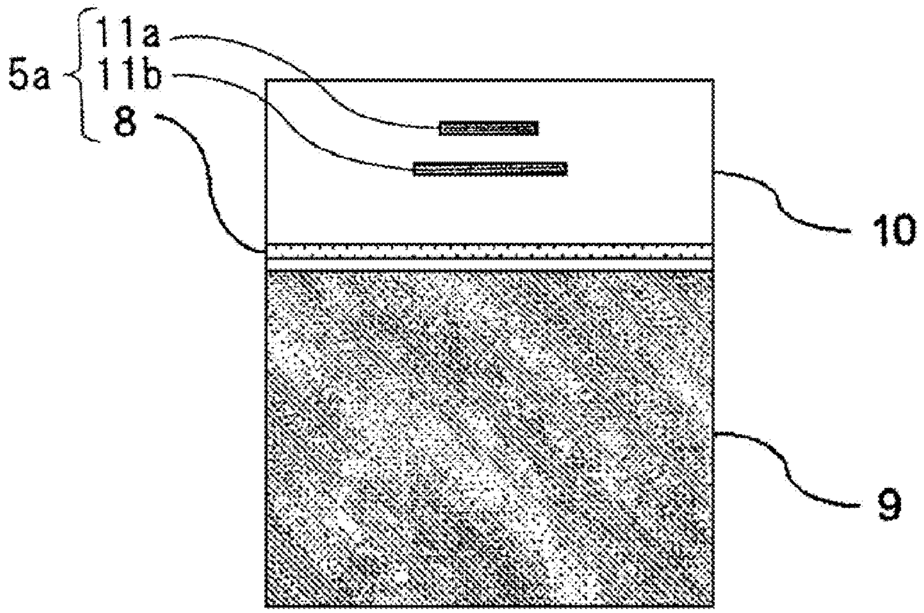
FIG. 4 is a sectional view showing a structure of a balun circuit of a first exemplary embodiment.

FIG. 3 is a plan view showing a structure of a balun circuit of a first exemplary embodiment and FIG. 4 is a sectional view showing the balun circuit shown in FIG. 3, taken along a line A-A'.

As shown in FIG. 3, a blaun circuit of a first exemplary embodiment has first CPW line 1, second CPW line 2*a* and third CPW line 2*b*, which are signal input/output ports, FCPW line 3, which is a non-differential transmission line, CPW-FCPW line conversion section 4 that converts first CPW line 1 into FCPW line 3, first differential transmission line 5*a* having a length of L1, second differential transmission line 5*b* having a length of L1+L2, line conversion branch section 6 that converts FCPW line 3 into first differential transmission line 5*a* and second differential transmission line 5*b*, first conversion section 7*a* that converts first differential transmission line 5*a* into second CPW line 2*a*, second conversion section 7*b* that converts second differential transmission line 5*b* into third CPW line 2*b*, and underlying conductor 8 that is connected to a ground potential, which are formed on substrate 9.

The respective ground conductors of first CPW line 1, second CPW line 2*a* and third CPW line 2*b* are arranged to surround the respective elements formed on substrate 9. In addition, the ground conductor of first CPW line 1, the ground conductor of second CPW line 2*a*, the ground conductor of third CPW line 2*b* and the ground conductor of FCPW line 3 are connected to underlying conductor 8 by ground via 12.

The conductors of one side of each of first differential transmission line 5*a* and second differential transmission line 5*b* are connected by via 13 between the strip-shaped conductors, so that first differential transmission line 5*a* and second differential transmission line 5*b* are commonly used. The common conductor is connected to the ground conductor of second CPW line 2*a* by ground via 12 and also to the central conductor of third CPW line 2*b*.

Further, the conductor of the other side of first differential transmission line 5*a*, which is not the common conductor, is connected to the central conductor of second CPW line 2*a*, and the conductor of the other side of second differential transmission line 5*b* is connected to ground conductor of third CPW line 2*b* by ground via 12. In line conversion branch section 6, the central conductor of FCPW line 3 is branched into two. The one is connected to second strip-shaped conductor 11*b* of first differential transmission line 5*a* through via 13 between the strip-shaped conductors and the other is connected to first strip-shaped conductor 11*a* of second differential transmission line 5*b*.

The ground conductor of the one of FCPW line 3 is connected to underlying conductor 8 by ground via 12 and first strip-shaped conductor 11*a* of first differential transmission line 5*a*. In addition, the ground conductor of the other of FCPW line 3 is connected to underlying conductor 8 and second strip-shaped conductor 11*b* of second differential transmission line 5*b* by ground via 12.

First differential transmission line 5*a* is comprised of first strip-shaped conductor (first line) 11*a* and second strip-shaped conductor (second line) 11*b* arranged in an underlying layer of first strip-shaped conductor 11*a*, which are arranged in dielectric layer 10 formed on substrate 9, and underlying conductor (underling line) 8 connected to a fixed potential arranged between substrate 9 and the second strip-shaped conductor, as shown in FIG. 4. Underlying conductor 8 is provided at a location in dielectric layer 10 near to substrate 9 and a transmission line using first strip-shaped conductor 11*a* and second strip-shaped conductor 11*b* is formed. Second differential transmission line 5*b* has the same structure as first differential transmission line 5*a*.

In general, the structure as shown in FIG. 4 is formed by using a multi-layer line process in which a sheet resistance becomes smaller the nearer it gets to the upper surface layer. Hence, a line width of second strip-shaped conductor 11*b* formed in the underlying layer of first strip-shaped conductor 11*a* is larger than that of first strip-shaped conductor 11*a* so that the loss by the resistances of each conductor is same.

Here, when a microwave signal is inputted into the differential transmission line of the structure shown in FIG. 4, a micro strip mode is generated by first strip-shaped conductor 11*a* and underlying conductor 8 and is generated by second strip-shaped conductor 11*b* and underlying conductor 8. In the mean time, first strip-shaped conductor 11*a* and second strip-shaped conductor 11*b* are electromagnetically coupled.

In the CPS line described in the Non-Patent Document 1, since the micro strip mode is predominant, the differential transmission is impossible. Meanwhile, in the structure shown in FIG. 4, two strip-shaped conductors 11*a*, 11*b* are sufficiently electromagnetically coupled by arranging them high and low, and a differential transmission line operates even when the micro strip modes are mixed.

At this time, the electric field generated in the differential transmission line and the electric field in the micro strip mode are shielded by underlying conductor 8 and do not reach substrate 8. Due to this, the signal passing through the transmission line is not influenced by the resistance component of substrate 8, so that the loss in transmitting a signal is decreased. In addition, since underlying conductor 8 is arranged below each of first CPW line 1, second CPW line 2*a*, third CPW line 2*b* and FCPW line 3, the same effect will occur.

Hence, according to the balun circuit of this exemplary embodiment, the signal is transmitted in a differential mode by differential transmission lines 5*a*, 5*b* in the circuit, contrary to the CPS line that does not transmit a signal in a differential mode when there is underlying conductor 8. Due to this, it is possible to obtain differential signals having a phase difference of 180 degrees from second CPW line 2*a* and third CPW line 2*b*.

Further, it is possible to compensate for the phase difference of the signals outputted from second CPW line 2*a* and third CPW line 2*b* by adjusting L2 that is a difference of the lengths of first differential transmission line 5*a* and second differential transmission line 5*b*.

In addition, since first strip-shaped conductor 11*a* and second strip-shaped conductor 11*b* are arranged to be overlapped, it is possible to make first differential transmission line 5*a* and second differential transmission line 5*b* smaller than the CPS line of the prior art. Additionally, it is possible to make the differential transmission lines smaller by arranging the lines in a crank shape, meander shape or spiral shape. Furthermore, it is possible to freely set the length (L1) of first differential transmission line 5*a* and second differential transmission line 5*b* within a range in which a layout area is permissible.

Hence, it is possible to downsize the balun circuit and to easily incorporate it to an integrated circuit.

In addition, since the ground conductors of first CPW line 1, second CPW line 2*a* and third CPW line 3*a*, which are signal I/O ports, are at the same potential, first CPW line 1, second CPW line 2*a* and third CPW line 3*a* operate in the same condition even when a 3-terminal active element and the like are connected to first CPW line 1, second CPW line 2*a* and third CPW line 3*a*. Accordingly, it is possible to realize a desired circuit performance.

Second Exemplary Embodiment

Figure 5:
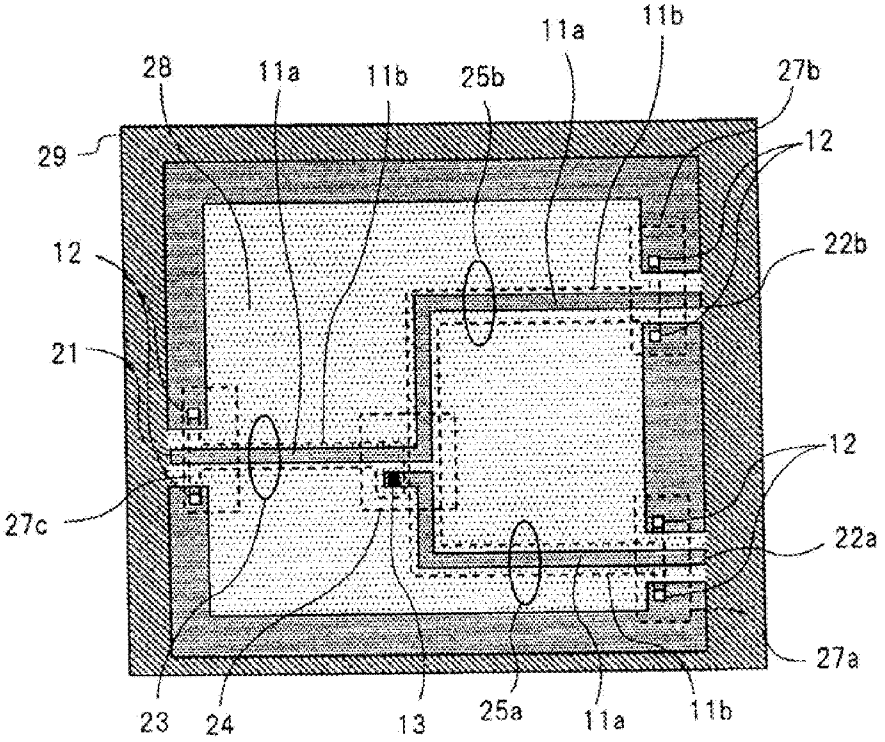
FIG. 5 is a plan view showing a structure of a balun circuit of a second exemplary embodiment.

As shown in FIG. 5, a balun circuit of a second exemplary embodiment has first CPW line 21, second CPW line 22*a* and third CPW line 22*b*, which are signal I/O ports, first differential transmission line 25*a* having a length of L3, second differential transmission line 25*b* having a length of L3+L4, third differential transmission line 23, line conversion section 27*c* that converts first CPW line 21 into third differential transmission line 23, differential transmission line branch section 24 that branches third differential transmission line 23 into first differential transmission line 25*a* and second differential transmission line 25*b*, first line conversion section 27*a* that converts first differential transmission line 25*a* into second CPW line 22*a*, second conversion section 27*b* that converts second differential transmission line 25*b* into third CPW line 22*b* and underlying conductor 28 that is connected to a ground potential, which are formed on substrate 29.

The conductors of one side of each of first differential transmission line 25*a* and second differential transmission line 25*b* are common. The common conductor is connected to the ground conductor of second CPW line 22*a* and the ground conductor of third CPW line 22*b* by ground via 12.

In addition, the conductor of the other side of first differential transmission line 25*a*, which is not the common conductor, is connected to the central conductor of second CPW line 22*a* and the conductor of the other side of second differential transmission line 25*b* is connected to the central conductor of third CPW line 22*b*.

The ground conductors of first CPW line 21, second CPW line 22*a* and third CPW line 22*b* are arranged to surround the respective elements formed on substrate 29. In addition, the ground conductors of each of first CPW line 21, second CPW line 22*a* and third CPW line 22*b* are connected to underlying conductor 28 by ground via 12.

Third differential transmission line 23 is branched into first differential transmission line 25*a* and second differential transmission line 25*b* by line branch section 24. To be more specific, first strip-shaped conductor 11*a* of third differential transmission line 23 is connected to first strip-shaped conductor 11*a* of second differential transmission line 25*b* and second strip-shaped conductor 11*b* of third differential transmission line 23 is connected to first strip-shaped conductor 11*a* of first differential transmission line 25*a* by via 13 between the strip-shaped conductors.

Differential transmission lines 25*a*, 25*b*, 23 of the second exemplary embodiment have the same structure as the differential transmission lines of the first exemplary embodiment and the same effect as the first exemplary embodiment can be made.

When the differential transmission lines are branched, they are respectively split in a reverse phase. Hence, the signals of reverse phase and the same power are transmitted to first differential transmission line 25*a* and second differential transmission line 25*b*. At this time, the common conductor of first differential transmission line 25*a* and second differential transmission line 25*b* is connected to the ground conductors in second CPW line 22*a* and third CPW line 22*b*. Thus, when the lengths of first differential transmission lines 25*a* and second differential transmission line 25*b* are the same (L4=0), the signals having a phase difference of 180 degrees will be outputted from second CPW line 22*a* and third CPW line 22*b*.

However, for a case where first CPW line 21 is used as an input port and second CPW line 22*a* and third CPW line 22*b* are used as output ports, when the respective ground conductors of first CPW line 21, second CPW line 22*a* and third CPW line 22*b* are connected and when another integrated circuit device having CPW lines and the like is connected to the respective CPW lines, a case may occur where a phase difference of the signals outputted from second CPW line 22*a* and third CPW line 22*b* is not 180 degrees and the same signal power is not split to first differential transmission line 25*a* and second differential transmission line 25*b*, as in the first exemplary embodiment.

Due to this, in this exemplary embodiment, in order to output the signals having a phase difference of 180 degrees from second CPW line 22*a* and third CPW line 22*b*, the length of first differential transmission line 25*a* and the length of second differential transmission line 25*b* are changed to compensate for the phase difference. In this exemplary embodiment, since the phase difference of the signals outputted from second CPW line 22*a* and third CPW line 22*b* is compensated for by the length of L4, it is possible to freely set the length L3 within a range in which a layout area is permissible.

Meanwhile, the splitting ratio of the signal power for first differential transmission line 25*a* and second differential transmission line 25*b* can be corrected by optimizing the shape of the ground conductors arranged on the periphery, as in the prior art.

FIG. 5 shows the structure in which the common conductors of first differential transmission line 25*a* and second differential transmission line 25*b* are connected to the ground conductors of second CPW line 22*a* and third CPW line 22*b*. However, a structure is possible in which the common conductors of first differential transmission line 25*a* and second differential transmission line 25*b* are connected to the central conductors of second CPW line 22*a* and third CPW line 22*b*. In this case, it is preferable that the conductor of the other side of first differential transmission line 25*a*, which is not the common conductor, be connected to the ground conductor of second CPW line 22*a*, and that the conductor of the other side of second differential transmission line 25*b* be connected to ground conductor of third CPW line 22*b*.

According to the balun circuit of the second exemplary embodiment, by providing first differential transmission line 25*a* for linking first CPW line 21 and second CPW line 22*a* and second differential transmission line 25*b* for linking first CPW line 21 and third CPW line 22*b*, it is possible to obtain differential signals having a phase difference of 180 degrees from second CPW line 22*a* and third CPW line 22*b*. In addition, since the area of the balun circuit can be downsized, it is possible to easily incorporate the balun circuit into an integrated circuit device.

Furthermore, since the ground conductors of first CPW line 21, second CPW line 22*a* and third CPW line 22*b*, which are signal I/O ports, are at the same potential, first CPW line 21, second CPW line 22*a* and third CPW line 22*b* operate in the same condition even when a 3-terminal active element and the like is connected to first CPW line 21, second CPW line 22*a* and third CPW line 22*b*. Accordingly, it is possible to realize a desired circuit performance.

Third Exemplary Embodiment

Figure 6:
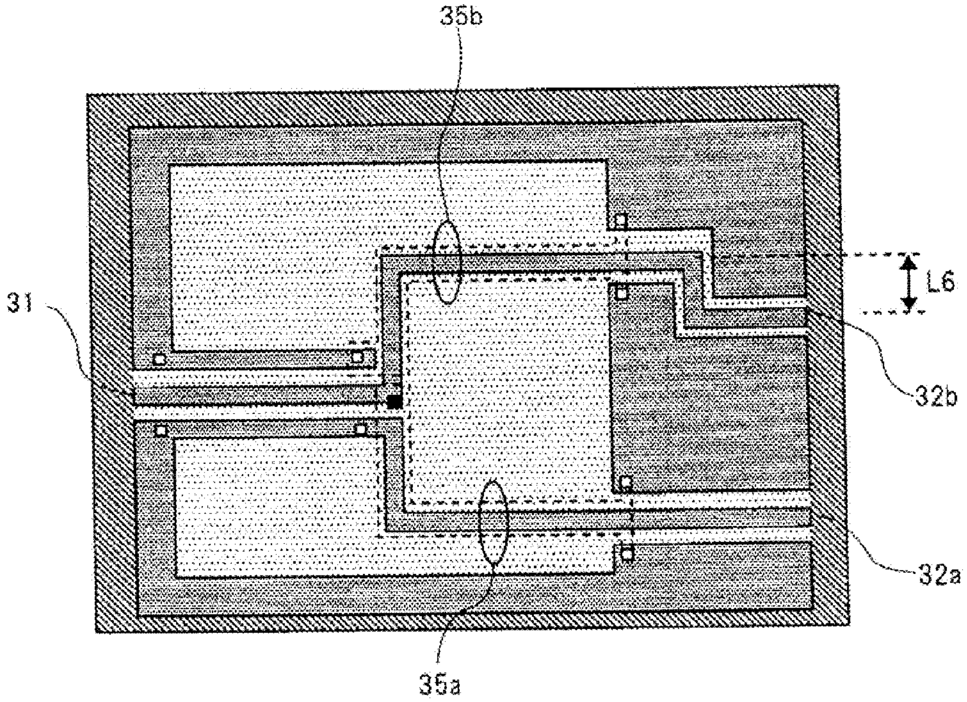
FIG. 6 is a plan view showing a structure of a balun circuit of a third exemplary embodiment.

As shown in FIG. 6, a balun circuit of a third exemplary embodiment is different from the first exemplary embodiment in that the lengths of first differential transmission line 35*a* and second differential transmission line 35*b* are the same (L5) and the lengths of second CPW line 32*a* and third CPW line 32*b* are different (a difference thereof is L6). Since the other structures are the same as the balun circuit of the first exemplary embodiment, descriptions thereof will be omitted.

In the balun circuit of the third exemplary embodiment, in order to output the signals having a phase difference of 180 degrees from second CPW line 32*a* and third CPW line 32*b*, a phase difference is compensated for by making the lengths of second CPW line 32*a* and third CPW line 32*b* different.

In this exemplary embodiment, since the phase difference of the signals outputted from second CPW line 32*a* and third CPW line 32*b* is compensated for by a value of L6, it is possible to freely set the length (L5) of first differential transmission line 35*a* and second differential transmission line 35*b* within a range in which a layout area is permissible.

To be more specific, the balun circuit shown in FIG. 6 can be downsized and easily incorporated into an integrated circuit device, as in the first and second exemplary embodiments. Due to this, the balun circuit of the third exemplary embodiment can realize the same effect as the first and second exemplary embodiments.

Meanwhile, in the third exemplary embodiment, it is possible to compensate for the phase difference of the signals outputted from second CPW line 32*a* and third CPW line 32*b* by changing the lengths of second CPW line 32*a* and third CPW line 32*b*. Due to this, it is not necessary to make the lengths of first differential transmission line 35*a* and second differential transmission line 35*b* same. That is, the lengths of these lines may be different.

In addition, FIG. 6 shows an example where the phase difference of the signals outputted from the second CPW line and the third CPW line is compensated for by changing the lengths of the second CPW line and the third CPW line of the balun circuit shown in the first exemplary embodiment. However, such a structure can be also applied to the balun circuit of the second exemplary embodiment. In other words, even when the lengths of the first and second differential transmission lines shown in FIG. 5 are set to be the same and even when the lengths of the second and third CPW lines are changed, it is possible to compensate for a phase difference of the signals outputted from the second and third CPW lines.

Fourth Exemplary Embodiment

Figure 1:
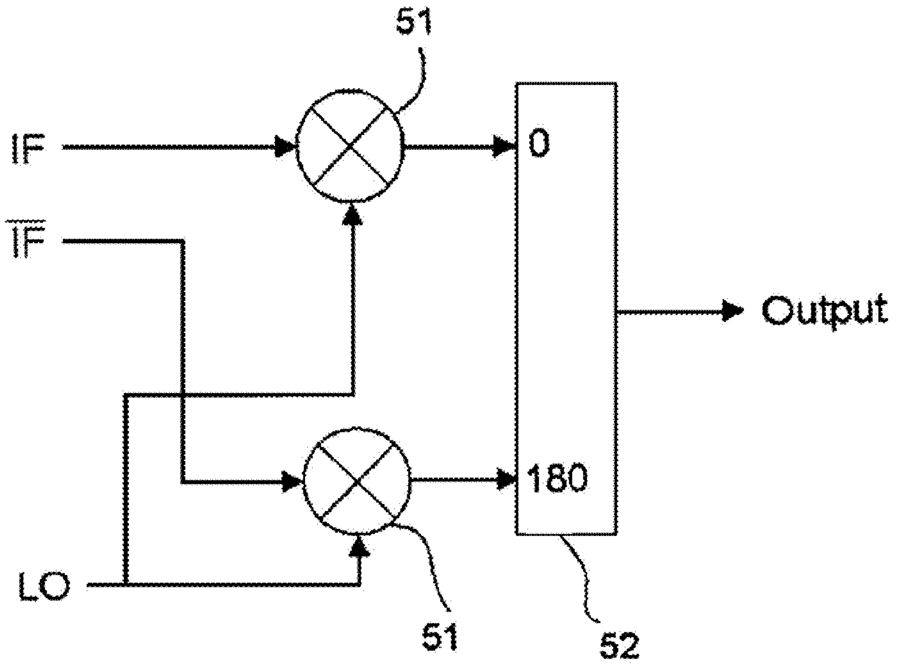
FIG. 1 is a circuit diagram showing a structure of a single balance-type mixer circuit.
Figure 2:
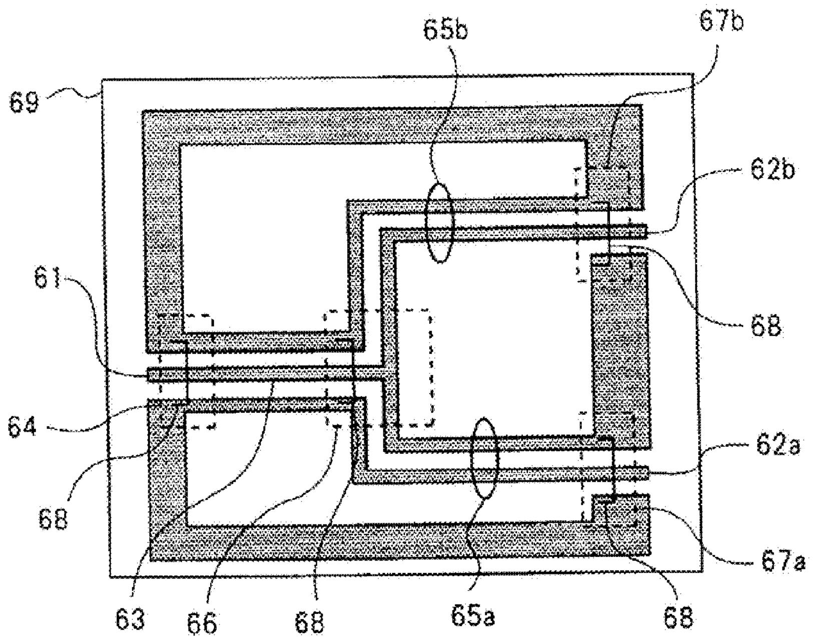
FIG. 2 is a plan view showing a structure of a balun circuit of the prior art.

The fourth exemplary embodiment is an example where the balun circuit of the first exemplary embodiment is used as the 180-degree phase combiner of the single balance-type mixer circuit shown in FIG. 1.

Figure 7:
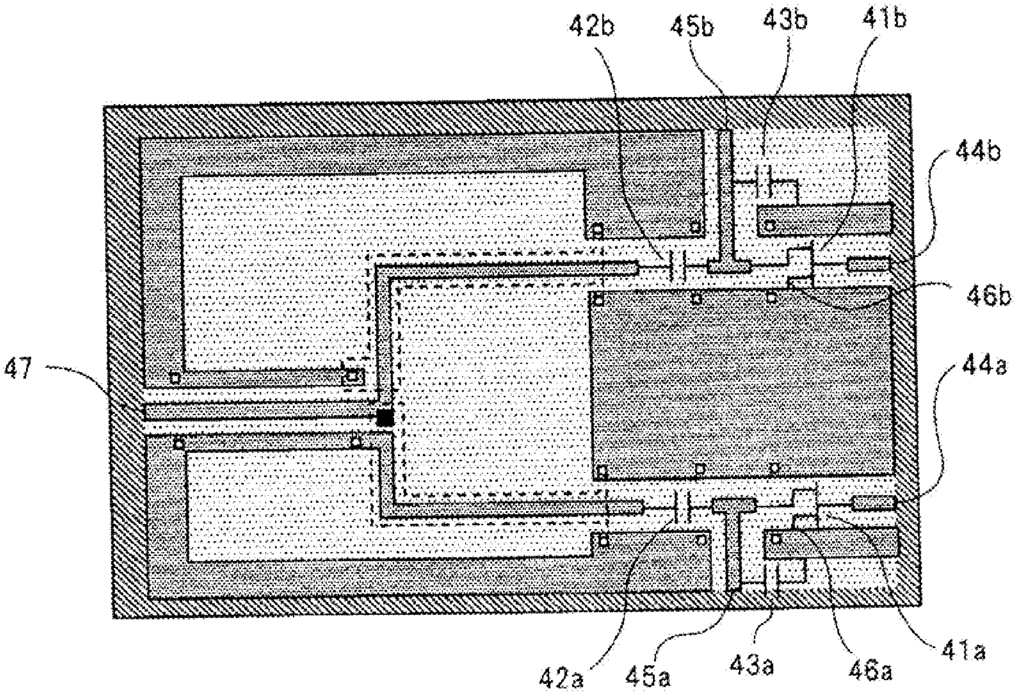
FIG. 7 is a plan view showing an example of an integrated circuit device having the balun circuit shown in FIG. 3.

As shown in FIG. 7, the integrated circuit device of this exemplary embodiment has the balun circuit shown in FIG. 3, two FETs 41*a*, 41*b*, which are mixer elements, capacitors 42*a*, 43*a* connected to FET 41*a* and capacitors 42*b*, 43*b* connected to FET 41*b*. In the branch section of the CPW line, the ground conductors of the underlying conductor and the CPW line are connected by using the ground via.

A source electrode of FET 41*a* that is the mixer element is connected to the ground conductor of the second CPW line of the balun circuit of the first exemplary embodiment and a source electrode of FET 41*b* is connected to the ground conductor of the third CPW line of the balun circuit of the first exemplary embodiment. Gate electrodes of FETs 41*a*, 41*b* are connected to a LO signal source and a gate bias source by first input ports 44*a*, 44*b*.

In addition, a drain electrode of FET 41*a* is connected to the central conductor of the second CPW line through capacitor 42*a* and a drain electrode of FET 41*b* is connected to the central conductor of the third CPW line through capacitor 42*b*. Furthermore, to the drain electrode of FET 41*a* are connected capacitor 43*a* having the other end connected to the ground conductor and a stub having a predetermined length. Through the stub, an IF signal is inputted from second input port 45*a*.

Likewise, to the drain electrode of FET 41*b* are connected capacitor 43*b* having the other end connected to the ground conductor and a stub having a predetermined length. Through the stub, an IF signal of a reverse phase is inputted from second input port 45*b*.

In the meantime, the capacitance of capacitors 43*a*, 43*b* is set to a value that impedance is open in the frequency of a RF signal when seen from the drain electrode and an insertion loss is lowest in the frequency of an IF signal.

In the above structure, an upper sideband signal, a lower sideband signal and a LO signal are outputted from the drain electrodes of FETs 41*a*, 41*b* that are mixer elements, the upper sideband signal and the lower sideband signal are combined to be in-phase by the balun circuit and the LO signal is combined to be a reverse phase by the balun circuit.

In the integrated circuit device of this exemplary embodiment, the source electrodes of two FETs 41*a*, 41*b* that are mixer elements are connected to the ground conductors by joints 46*a*, 46*b*. As described in the first exemplary embodiment, since the potentials of the respective ground conductors are the same, the operating conditions of two FETs 41*a*, 41*b* are the same and the powers of the LO signals outputted from FETs 41*a*, 41*b* are the same.

Hence, the LO signals outputted from two FETs 41*a*, 41*b* are combined to be a reverse phase and are thus cancelled by the balun circuit shown in FIG. 7, and the power of the LO signal included in the signal of output port 47 is reduced.

In addition, according to this exemplary embodiment, since the balun circuit can be downsized, the integrated circuit device having the balun circuit can be downsized.

Meanwhile, the fourth exemplary embodiment shows an example where the balun circuit of the first exemplary embodiment is used as a 180-degree phase combiner of the single balance-type mixer circuit. However, the balun circuits shown in the second and third exemplary embodiments can be also used as a 180-degree phase combiner of the single balance-type mixer circuit.

In addition, the balun circuit shown in the first to third exemplary embodiments is not limited to the single balance-type mixer circuit shown in this exemplary embodiment. In other words, the balun circuit can be used as any circuit as long as it is a circuit enabling two signals to have a phase difference of 180 degrees, such as multiplication circuit, differential amplification circuit and the like. When using the balun circuit shown in the first to third exemplary embodiments, it is possible to reduce the overall size of an integrated circuit device comprising the balun circuit.

Additionally, in the differential transmission lines shown in the first to fourth embodiments, it is possible to adjust the degree of coupling of the differential transmission lines by appropriately adjusting the gap and conductor width of first strip-shaped conductor 11*a* and second strip-shaped conductor 11*b*. In addition, it is possible to adjust the degree of coupling of the differential transmission lines by offsetting the central positions of first strip-shaped conductor 11*a* and second strip-shaped conductor 11*b*.

In addition, the differential transmission line is not limited to the structure shown in FIG. 4. That is, it may have a sectional structure as shown in FIGS. 8 to 10.

Figure 8:
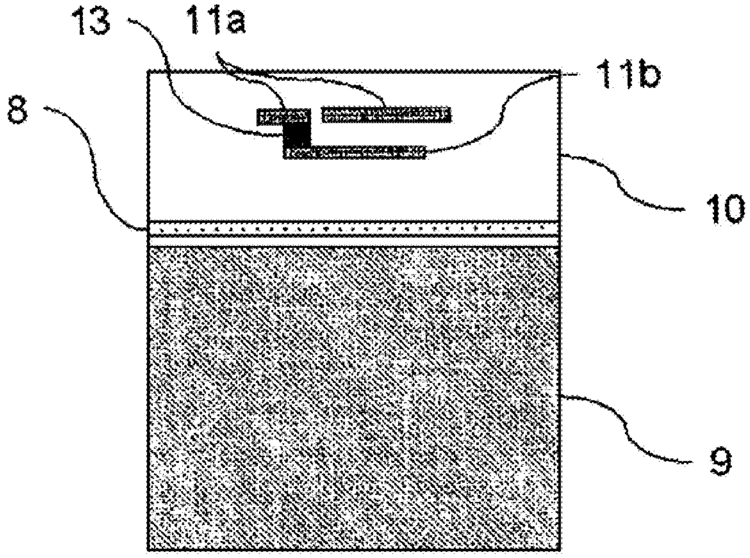
FIG. 8 is a sectional view showing another example of a differential transmission line.

The differential transmission line shown in FIG. 8 has a structure such that two first strip-shaped conductors 11*a* are comprised and one of the conductors is connected to second strip-shaped conductor 11*b* by via 13 between the strip-shaped conductors, thereby making the effective sheet resistances the same.

Figure 9:
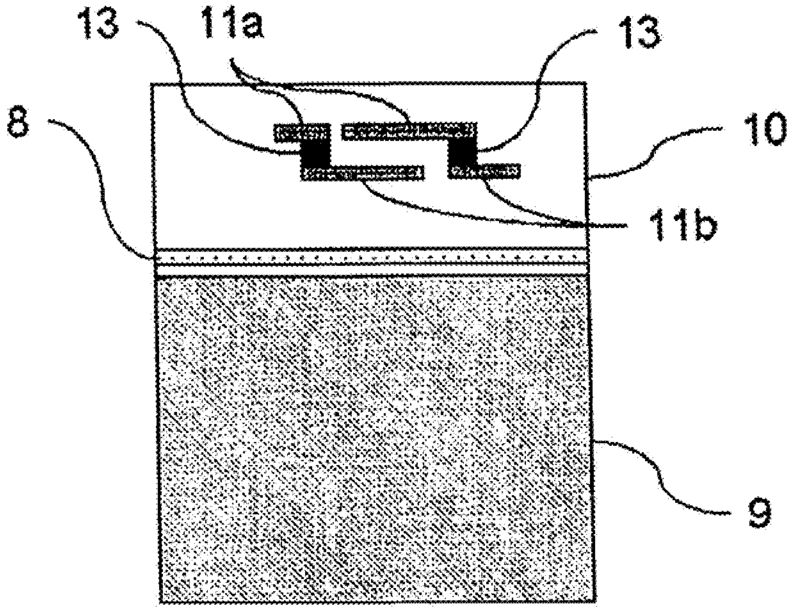
FIG. 9 is a sectional view showing another example of a differential transmission line.

The differential transmission line shown in FIG. 9 has a structure such that second strip-shaped conductor 11*b* is added to the differential transmission line shown in FIG. 8 and two sets of first strip-shaped conductors 11*a* and second strip-shaped conductors 11*b* are respectively connected by via 13 between the strip-shaped conductors. The transmission line shown in FIG. 9 obtains the same effects as the differential transmission line shown in FIG. 8 and the coupling with underlying conductor 8 can be easily adjusted.

Figure 10:
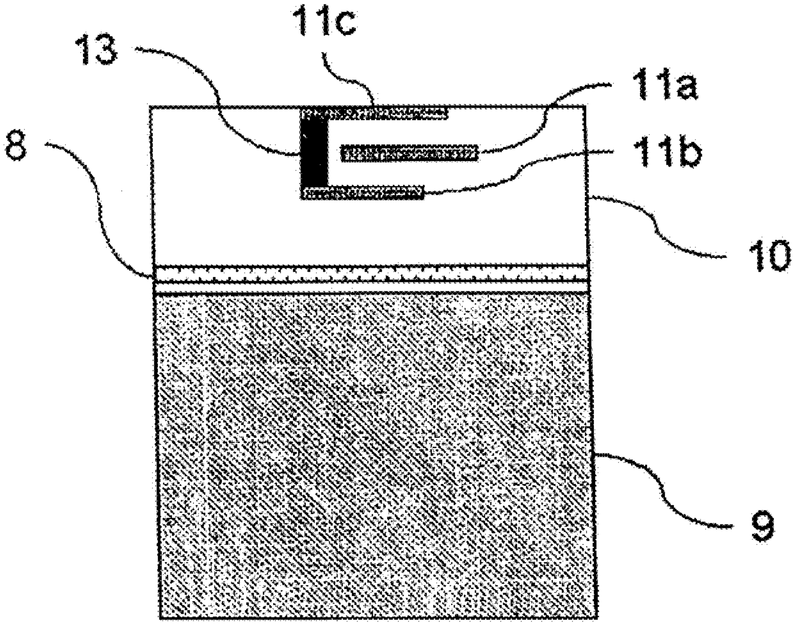
FIG. 10 is a sectional view showing another example of a differential transmission line.

The differential transmission line shown in FIG. 10 has a structure such that third strip-shaped conductor 11*c* is arranged in an upper layer of first strip-shaped conductor 11*a* and third strip-shaped conductor 11*c* and second strip-shaped conductor 11*b* are connected by via 13 between the strip-shaped conductors. The transmission line shown in FIG. 10 obtains the same effects as the differential transmission lines shown in FIGS. 8 and 9. Further, the coupling between the strip-shaped conductors is strong and it is possible to easily make a design in which a desired coupling is made by adjusting the line width and gap of the respective strip-shaped conductors.

In the meantime, the first to third exemplary embodiments show an example where underlying conductor 8 is connected to the ground potential. However, underlying conductor 8 may be at a fixed potential and may be connected to a power supply voltage, for example.

Further, although a dielectric substrate, a semiconductor substrate and the like are used as the substrate on which the balun circuit shown in the first to third exemplary embodiments is incorporated, the material of the substrate is not limited thereto. For example, the substrate may be a conductive substrate of silicon, a semi-insulating substrate of gallium arsenide or an insulating substrate.

Additionally, although the first to third exemplary embodiments show an example where a plate-shaped conductor is used for underlying conductor 8, underlying conductor 8 may have a stripe shape or a lattice shape.

Furthermore, underlying conductor 8 may be arranged on only a part of the balun circuit as long as it has sufficient size to shield the electric field. In addition, the underlying conductor may not be comprised when the substrate loss is not problematic.

In addition, although the first to third exemplary embodiments show an example where the ground conductors of all the CPW lines and FCPW lines are connected to underlying conductor 8 by using the ground via and the ground conductors of each line are connected to each other through underlying conductor 8, such a connection is made so as to stabilize the signal transmission mode in the CPW lines. Thus, if a signal is without fail transmitted without loss, it is not necessary to connect the ground conductors of all the CPW lines and FCPW lines. Further, it is not necessary to use the ground via and the underlying conductor so as to connect the ground conductors of each of the CPW lines and FCPW lines. For example, an air bridge may be used.

Furthermore, although the first to third exemplary embodiments show an example where the CPW lines are used as signal I/O ports, it is possible to replace at least one thereof with a FCPW line having a definite ground conductor width.

In addition, according to the first to fourth exemplary embodiments, each of the following the ground conductor of the first CPW line, the ground conductor of the second CPW line and the ground conductor of the third CPW line are connected by the surrounding conductor. However, it is sufficient if at least two ground conductors are connected to each other.

This application is based upon and claims the benefit of priority from Japanese patent application No. 2007-068426, filed on Mar. 16, 2007, the disclosure of which is incorporated herein in its entirety by reference.

The invention claimed is:

1. A balun circuit comprising:

a first CPW line, a second CPW line and a third CPW line that become signal I/O ports;

a first differential transmission line that links a central conductor of said second CPW line and a ground conductor of said first CPW line and links a ground conductor of said second CPW line and a central conductor of said first CPW line;

a second differential transmission line that links a central conductor of said third CPW line and the central conductor of said first CPW line and links a ground conductor of said third CPW line and the ground conductor of said first CPW line; and a joint that connects two or more of the ground conductor of said first CPW line, the ground conductor of said second CPW line and the ground conductor of said third CPW line, wherein said first differential transmission line and said second differential transmission line have a first line, a second line and an underlying layer connected to a fixed potential arranged between a substrate and said second line, said first line and said second line being formed in a dielectric layer on said substrate and said second line being formed at a position nearer to said substrate than said first line and being electromagnetically coupled to said first line.

2. The balun circuit according to claim 1, further comprising:

a FCPW line that is a non-differential transmission line;

a CPW-FCPW line conversion section that converts said first CPW line into said FCPW line;

a line conversion branch section that converts said FCPW line into said first differential transmission line and said second differential transmission line; and a plurality of line conversion sections that convert said first differential transmission line into said second CPW line and that convert said second differential transmission line into said third CPW line.

3. A balun circuit comprising:

a first CPW line, a second CPW line and a third CPW line that become signal I/O ports;

a first differential transmission line that links a central conductor of said second CPW line and a central conductor of said first CPW line and links a ground conductor of said second CPW line and a ground conductor of said third CPW line;

a second differential transmission line that links a central conductor of said third CPW line and the ground conductor of said first CPW line and links the ground conductor of said third CPW line and the ground conductor of said second CPW line; and a joint that connects two or more of the ground conductor of said first CPW line, the ground conductor of said second CPW line and the ground conductor of said third CPW line, wherein said first differential transmission line and said second differential transmission line have a first line, a second line and an underlying layer connected to a fixed potential arranged between a substrate and said second line, said first line and said second line being formed in a dielectric layer on said substrate and said second line being formed at a position nearer to said substrate than said first line and being electromagnetically coupled to said first line.

4. A balun circuit comprising:

a first CPW line, a second CPW line and a third CPW line that become signal I/O ports;

a first differential transmission line that links a central conductor of said second CPW line and a central conductor of said third CPW line and links a ground conductor of said second CPW line and a central conductor of said first CPW line;

a second differential transmission line that links the central conductor of said third CPW line and the central conductor of said second CPW line and links a ground conductor of said third CPW line and a ground conductor of said first CPW line; and a joint that connects two or more of the ground conductor of said first CPW line, the ground conductor of said second CPW line and the ground conductor of said third CPW line, where said first differential transmission line and said second differential transmission line have a first line, a second line and an underlying layer connected to a fixed potential arranged between a substrate and said second line, said first line and said second line being formed in a dielectric layer on said substrate and said second line being formed at a position nearer to said substrate than said first line and being electromagnetically coupled to said first line.

5. The balun circuit according to claim 3, further comprising:

a third differential transmission line that is connected to the central conductor and ground conductor of said first CPW line;

a line conversion section that converts said first CPW line into said third differential transmission line;

a branch section that converts said third differential transmission line into said first differential transmission line and said second differential transmission line; and a plurality of conversion sections that convert said first differential transmission line into said second CPW line and that convert said second differential transmission line into said third CPW line.

6. The balun circuit according to claim 1, wherein lengths of said first differential transmission line and said second differential transmission line are different.

7. The balun circuit according to claim 1, wherein a line formed in a line layer between said transmission line and the substrate is connected to a ground potential or power supply voltage.

8. The balun circuit according to claim 1, wherein lengths of said second CPW line and said third CPW line are different.

9. The balun circuit according to claim 1, wherein a FCPW line is used for one or more of said first CPW line, said second CPW line and said third CPW line.

10. An integrated circuit device comprising:

the balun circuit according to claim 1; and a plurality of 3-terminal active elements that are connected to said second CPW line and said third CPW line of the balun circuit.

11. The balun circuit according to claim 4, further comprising:

a third differential transmission line that is connected to the central conductor and ground conductor of said first CPW line;

a line conversion section that converts said first CPW line into said third differential transmission line;

a branch section that converts said third differential transmission line into said first differential transmission line and said second differential transmission line; and a plurality of conversion sections that convert said first differential transmission line into said second CPW line and that convert said second differential transmission line into said third CPW line.

12. The balun circuit according to claim 3, wherein lengths of said first differential transmission line and said second differential transmission line are different.

13. The balun circuit according to claim 3, wherein a line formed in a line layer between said transmission line and the substrate is connected to a ground potential or power supply voltage.

14. The balun circuit according to claim 3, wherein lengths of said second CPW line and said third CPW line are different.

15. The balun circuit according to claim 3, wherein a FCPW line is used for one or more of said first CPW line, said second CPW line and said third CPW line.

16. The balun circuit according to claim 4, wherein lengths of said first differential transmission line and said second differential transmission line are different.

17. The balun circuit according to claim 4, wherein a line formed in a line layer between said transmission line and the substrate is connected to a ground potential or power supply voltage.

18. The balun circuit according to claim 4, wherein lengths of said second CPW line and said third CPW line are different.

19. The balun circuit according to claim 4, wherein a FCPW line is used for one or more of said first CPW line, said second CPW line and said third CPW line.

20. An integrated circuit device comprising:

the balun circuit according to claim 3; and a plurality of 3-terminal active elements that are connected to said second CPW line and said third CPW line of the balun circuit.

21. An integrated circuit device comprising:

the balun circuit according to claim 4; and a plurality of 3-terminal active elements that are connected to said second CPW line and said third CPW line of the balun circuit.

* * * * *